United States Patent
Markle et al.

(10) Patent No.: US 7,774,670 B2
(45) Date of Patent: Aug. 10, 2010

(54) METHOD AND APPARATUS FOR DYNAMICALLY DETERMINING TESTER RECIPES

(75) Inventors: Richard J. Markle, Austin, TX (US); Douglas C. Kimbrough, Austin, TX (US); Eric O. Green, Austin, TX (US); Robert J. Chong, Austin, TX (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 401 days.

(21) Appl. No.: 11/853,304

(22) Filed: Sep. 11, 2007

(65) Prior Publication Data

US 2009/0070644 A1 Mar. 12, 2009

(51) Int. Cl.
 *G01R 31/28* (2006.01)
 *G06F 11/00* (2006.01)
(52) U.S. Cl. .......... 714/745; 714/741; 714/31; 714/33; 714/37
(58) Field of Classification Search ........ 702/57, 702/64, 65, 75; 714/745, 741, 31, 33, 37, 714/724, 733, 734, 819, 822, 25, 47–48; 324/522, 523, 527, 763, 765, 76.39, 76.41
See application file for complete search history.

(56) References Cited

U.S. PATENT DOCUMENTS

| | | | | |
|---|---|---|---|---|
| 5,396,168 A * | 3/1995 | Heep et al. | ............ | 324/115 |
| 6,326,800 B1 | 12/2001 | Kirihata | ............ | 324/760 |
| 6,789,239 B2 * | 9/2004 | Yamada | ............ | 716/4 |
| 7,047,442 B2 * | 5/2006 | Sutton | ............ | 714/25 |
| 7,242,198 B2 * | 7/2007 | Schneider et al. | ............ | 324/686 |
| 2005/0024064 A1 | 2/2005 | Haass et al. | ............ | 324/600 |
| 2005/0090916 A1 | 4/2005 | Aghababazadeh | ............ | 700/90 |
| 2005/0222798 A1 | 10/2005 | Waschura et al. | ............ | 702/127 |

OTHER PUBLICATIONS

PCT Search Report and Written Opinion for PCT/US2008/010618 dated Dec. 23, 2008.

* cited by examiner

*Primary Examiner*—Christine T Tu
(74) *Attorney, Agent, or Firm*—Williams, Morgan & Amerson, P.C.

(57) ABSTRACT

A method includes retrieving a group test parameter determined based on test results associated with a plurality of integrated circuit devices. A particular integrated circuit device is tested using a test program and the group test parameter.

12 Claims, 3 Drawing Sheets

METHOD AND APPARATUS FOR DYNAMICALLY DETERMINING TESTER RECIPES

CROSS-REFERENCE TO RELATED APPLICATIONS

Not applicable.

BACKGROUND OF THE INVENTION

The disclosed subject matter relates generally to manufacturing and, more particularly, to a method and apparatus for dynamically determining tester recipes.

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing the defects in the manufacture of the components of a typical transistor also lowers the overall cost per transistor as well as the cost of integrated circuit devices incorporating such transistors.

Generally, a set of processing steps is performed on a wafer using a variety of processing tools, including photolithography steppers, etch tools, deposition tools, polishing tools, rapid thermal processing tools, implantation tools, etc. During the fabrication process various events may take place that affect the performance of the devices being fabricated. That is, variations in the fabrication process steps result in device performance variations. Factors, such as feature critical dimensions, doping levels, contact resistance, particle contamination, etc., all may potentially affect the end performance of the device.

After fabrication of the devices is complete, each wafer is subjected to preliminary functional tests, commonly referred to as final wafer electrical tests (FWET) that evaluate test structures on the wafer and SORT tests that evaluate each die. Wafers that pass these tests are then cut to singulate the individual die, which are then packed in substrates. Packed die are then subjected to additional tests against the specification of customers' orders to determine performance characteristics such as maximum operating speed, power, caches, etc.

Exemplary tests include initial class tests (ICL) that is a preliminary test for power and speed. ICL testing is usually followed by burn-in (BI) and post burn-in (PBI) tests that test packaged die under specified temperature and/or voltage stress, and automatic test equipment (ATE) tests that test die functionality. Then, packaged die with different characteristics go through system-level tests (SLT) in which they are tested against customer requirements on specific electrical characteristics. In SLT, packaged die are tested in an actual motherboard by running system-level tests (e.g., variance test programs). After completion of the testing, the devices are fused, marked, and packed to fill customer orders. This back-end processing is commonly referred to as the test, mark, pack (TMP) process.

Typically, test instructions and acceptance criteria are defined for each test program implemented by a tester. These programs are typically stored in a central database and essentially static. A tester may periodically download the most current "golden" test program from a central data store prior to implementing the test. The recipe database allows revision and configuration control. However, the test program is executed without change once it is downloaded by the tester. Hence, the test flow and acceptance criteria employed by the tester are static.

Device testing is often an iterative process that involves testing the device using various frequency and voltage ranges to attempt to accurately determine the maximum frequency and minimum voltage capabilities of the device. The length of the test program and the resulting throughput of the tester is thus directly proportional to the number of test iterations required.

This section of this document is intended to introduce various aspects of art that may be related to various aspects of the disclosed subject matter described and/or claimed below. This section provides background information to facilitate a better understanding of the various aspects of the disclosed subject matter. It should be understood that the statements in this section of this document are to be read in this light, and not as admissions of prior art. The disclosed subject matter is directed to overcoming, or at least reducing the effects of, one or more of the problems set forth above.

BRIEF SUMMARY OF THE INVENTION

The following presents a simplified summary of the disclosed subject matter in order to provide a basic understanding of some aspects thereof. This summary is not an exhaustive overview of the disclosed subject matter. It is not intended to identify key or critical elements of the disclosed subject matter or to delineate the scope of the disclosed subject matter. Its sole purpose is to present some concepts in a simplified form as a prelude to the more detailed description that is discussed later.

One aspect of the disclosed subject matter is seen in a method for testing integrated circuit devices. The method includes retrieving a group test parameter determined based on test results associated with a plurality of integrated circuit devices. A particular integrated circuit device is tested using a test program and the group test parameter.

Another aspect of the disclosed subject matter is seen in a system including a test controller and a device tester. The test controller is operable to determine a group test parameter based on test results associated with a plurality of integrated circuit devices. The device tester is operable to test a particular integrated circuit device using a test program and the group test parameter.

BRIEF DESCRIPTION OF THE SEVERAL VIEWS OF THE DRAWINGS

The disclosed subject matter will hereafter be described with reference to the accompanying drawings, wherein like reference numerals denote like elements, and.

Figure 1:
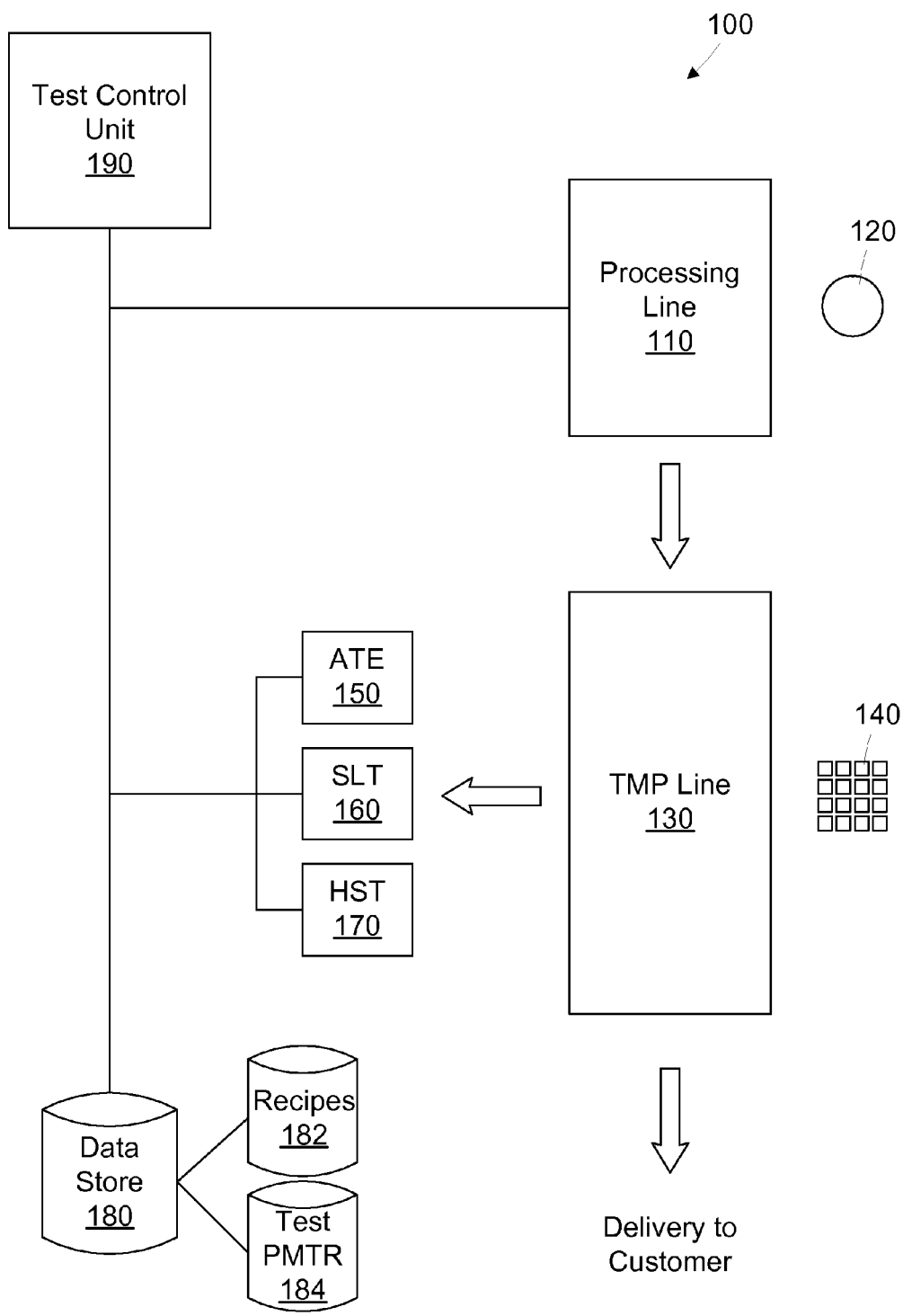
FIG. 1 is a simplified block diagram of a manufacturing system in accordance with one embodiment of the disclosed subject matter.

While the disclosed subject matter is susceptible to various modifications and alternative forms, specific embodiments thereof have been shown by way of example in the drawings and are herein described in detail. It should be understood, however, that the description herein of specific embodiments is not intended to limit the disclosed subject matter to the particular forms disclosed, but on the contrary, the intention is to cover all modifications, equivalents, and alternatives falling within the spirit and scope of the disclosed subject matter as defined by the appended claims.

DETAILED DESCRIPTION OF THE INVENTION

One or more specific embodiments of the disclosed subject matter will be described below. It is specifically intended that the disclosed subject matter not be limited to the embodiments and illustrations contained herein, but include modified forms of those embodiments including portions of the embodiments and combinations of elements of different embodiments as come within the scope of the following claims. It should be appreciated that in the development of any such actual implementation, as in any engineering or design project, numerous implementation-specific decisions must be made to achieve the developers' specific goals, such as compliance with system-related and business related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Nothing in this application is considered critical or essential to the disclosed subject matter unless explicitly indicated as being "critical" or "essential."

The disclosed subject matter will now be described with reference to the attached figures. Various structures, systems and devices are schematically depicted in the drawings for purposes of explanation only and so as to not obscure the disclosed subject matter with details that are well known to those skilled in the art. Nevertheless, the attached drawings are included to describe and explain illustrative examples of the disclosed subject matter. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Portions of the disclosed subject matter and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "accessing" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices. Note also that the software implemented aspects of the disclosed subject matter are typically encoded on some form of program storage medium or implemented over some type of transmission medium. The program storage medium may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The disclosed subject matter is not limited by these aspects of any given implementation.

Referring now to the drawings wherein like reference numbers correspond to similar components throughout the several views and, specifically, referring to FIG. 1, the disclosed subject matter shall be described in the context of an illustrative manufacturing system 100. The manufacturing system 100 includes a processing line 110 for fabricating wafers 120, a test, mark, pack (TMP) line 130 for processing devices 140, an automated test equipment (ATE) tester 150, a system lever tester (ST) 160, a hybrid system tester (HST) 170, a data store 180, and a test control unit 190.

In the illustrated embodiment, wafers 120 are processed by the processing line 110 to fabricate die thereon. The processing line 110 may include a variety of process tools and/or metrology tools, which may be used to process and/or examine the wafers to fabricate the semiconductor devices. For example, the process tools may include photolithography steppers, etch tools, deposition tools, polishing tools, rapid thermal anneal tools, ion implantation tools, and the like. The process metrology tools may include thickness measurement tools, scatterometers, ellipsometers, scanning electron microscopes, and the like. Techniques for processing the wafers 120 are well known to persons of ordinary skill in the art and therefore will not be discussed in detail herein for clarity and to avoid obscuring the disclosed subject matter. Although a single wafer 120 is pictured in FIG. 1, it is to be understood that the wafer 120 is representative of a single wafer as well as a group of wafers, e.g. all or a portion of a wafer lot that may be processed in the processing line 110.

After the wafers 120 have been processed in the processing line 110 to fabricate the die, certain metrology tools, such as sort or final wafer electrical test (FWET) tools may be employed to collect electrical performance data while the wafer is still uncut. Sort metrology employs a series of probes to electrically contact pads on the completed die to perform electrical and functional tests. For example, a sort metrology tool may measure voltages and/or currents between various nodes and circuits that are formed on the wafer 120. Exemplary sort parameters measured include, but are not limited to, clock search parameters, diode characteristics, scan logic voltage, static $I_{DD}$, minimum $V_{DD}$, power supply open short characteristics, and ring oscillator frequency, etc. The particular sort parameters selected may vary depending on the application and the nature of the device formed on the die. Final wafer electrical testing (FWET) entails parametric testing of discrete structures like transistors, capacitors, resistors, interconnects and relatively small and simple circuits, such as ring oscillators. It is intended to provide a quick indication as to whether or not the wafer is within basic manufacturing specification limits. Wafers that exceed these limits are typically discarded so as to not waste subsequent time or resources on them.

After the die on the wafer 120 have completed preliminary testing, the wafers 120 are cut to singulate the die. Each die is then each mounted to a package, resulting in the devices 140. The test units 150, 160, 170 then subject the devices 140 to various testing programs to grade the devices and verify full functionality. Although only single testers 150, 160, 170 are illustrated, an actual implementation will involve multiple testers 150, 160, 170 of each type. In addition, a particular tester 150, 160, 170 may test multiple devices 140 in parallel.

Typically, ATE testers 150 are designed for high throughput, high accuracy testing. For example, an ATE tester 150 generally can run tests at different voltage levels with precise voltage control. The system level tester 160 is configured to test devices in an actual system environment, such as by booting an operating system. System level testers 160 do not exhibit the speed characteristics or the voltage control characteristics of ATE testers 150. Hybrid system testers 170 are configured to perform burn-in tests and system level tests.

The data store 180 houses information related to the testing of the devices 140 over the plurality of test program runs, or insertions. In the illustrated example, an ATE tester 150 performs initial testing of the devices 140 to establish power and speed characteristics. The following examples illustrate how dynamic test recipes may be employed for testing devices 140. Although the examples relate to testing in an ATE tester 150, the approaches may also be applied to system level testers 160 or hybrid system testers 170.

In general, the ATE tester uses a baseline test program that is augmented with external test parameters determined by a test control unit 190. The ATE tester 150 retrieves the baseline test program from a recipe database 182 included in the data store 180. The test program specifies the general test protocol for determining the power and speed characteristics of the devices 140.

The test control unit 190 monitors results associated with previous device tests to attempt to identify test parameters that may be changed to increase the effectiveness of the subsequent testing. Test results associated with devices of the same type are evaluated to generate a group test parameter that may be stored in a test parameter database 184 in the data store 180. Thus, the ATE tester 150 may load the general test program from the recipe database 182 and one or more group test parameters from the test parameter database 184.

In one embodiment, the group test parameter specifies a starting point or test range for an iterative test procedure. The test control unit 190 determines the test range based on the results of previous tests. For example, an iterative test is typically performed to determine the power and speed characteristics of a device 140. The test program typically specifies a starting frequency for the testing. The starting frequency is typically higher than the expected operating frequency of the device. Each frequency test may be repeated at different voltage levels to determine the speed and power characteristics of the device 140. The frequency and power parameters of the tests are modified through the iterations to determine the maximum frequency characteristics and minimum voltage characteristics of the device. Test iterations that result in failed tests (e.g., frequency too high or voltage too low) consume test time, and thereby reduce the throughput of ATE tester 150. Rather than using a fixed starting point for the iterative speed and power testing, the ATE tester 150 accesses a test parameter database 184 in the data store 180 to determine the starting point for the type of device being tested. Additional group test parameters may specify test range information for voltage testing. The test control unit 190 may update the group test parameters as data regarding similar devices 140 indicates a reduced range for the expected values for the device type. By testing over a smaller range, the overall test time may be reduced, thereby increasing throughput.

If a particular device 140 passes the testing at the specified starting point, the ATE tester 150 increases the frequency to determine if the device 140 can pass a test at a higher frequency. In this manner, the test range does not limit the grade associated with a particular device 140, but rather serves to tailor the testing so that the overall test time for the population of devices can be reduced. The number of additional tests required to grade those devices that actually perform better than the expected test range is significantly less than the number of additional tests that would be performed on a collective basis if the test range was not adjusted based on the group results.

In another embodiment, the test control unit 190 may determine acceptance criteria for one or more tests performed by the testers 150, 160, 170. The acceptance criteria may be adjusted based on population statistics. Statistical techniques for dynamically determining acceptance criteria (i.e., also referred to as control limits) are known to those of ordinary skill in the art.

Figure 2:
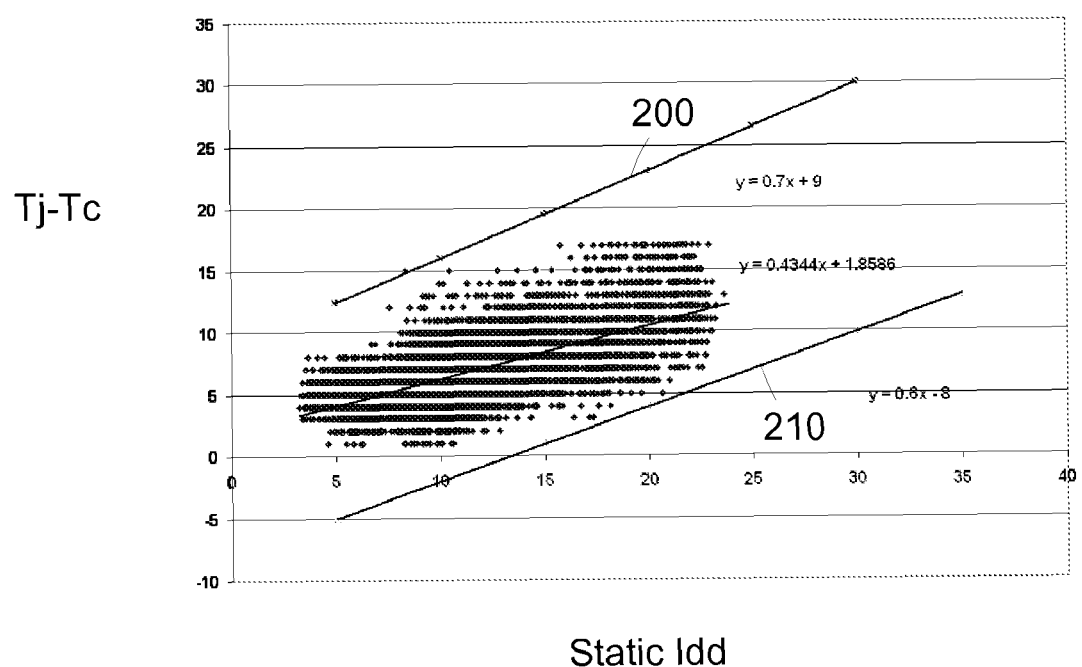
FIG. 2 is a diagram illustrating acceptance criteria that may be employed by a tester in the system of FIG. 1.

Referring briefly to FIG. 2, a graph illustrating example performance parameters determined by ATE testing is provided. In one particular test, static Idd is compared to the difference between junction temperature (Tj) and case temperature (Tc) using thresholds 200, 210. These parameters may be determined by an ATE tester 150 following a burn-in of a device 140. For uncompromised devices, these parameters should follow known relationships. Devices that do not follow these expected patterns may be compromised (i.e., damaged by the burn-in process. The thresholds 200, 210 are selected to screen out devices 140 that may be defective. The test control unit 190 may determine the thresholds 200, 210 based on the data associated with the population of similar devices. The test control unit 190 may adjust the thresholds 200, 210 dynamically, so that shifts in the population are reflected in revised acceptance criteria. The test control unit 190 stores acceptance criteria as group test parameters in the test parameter database 184.

Because group test parameters are stored in the test parameter database 184, test programs employed by the various testers 150, 160, 170 may be dynamically adjusted to reflect the characteristics of the population. In this manner the effectiveness of the testing may be increased relative to testing using a static test program. Dynamically adjusting test ranges increases the throughput of the testers 150, 160, 170, while dynamically adjusting acceptance criteria allows more effective device characterization.

Figure 3:
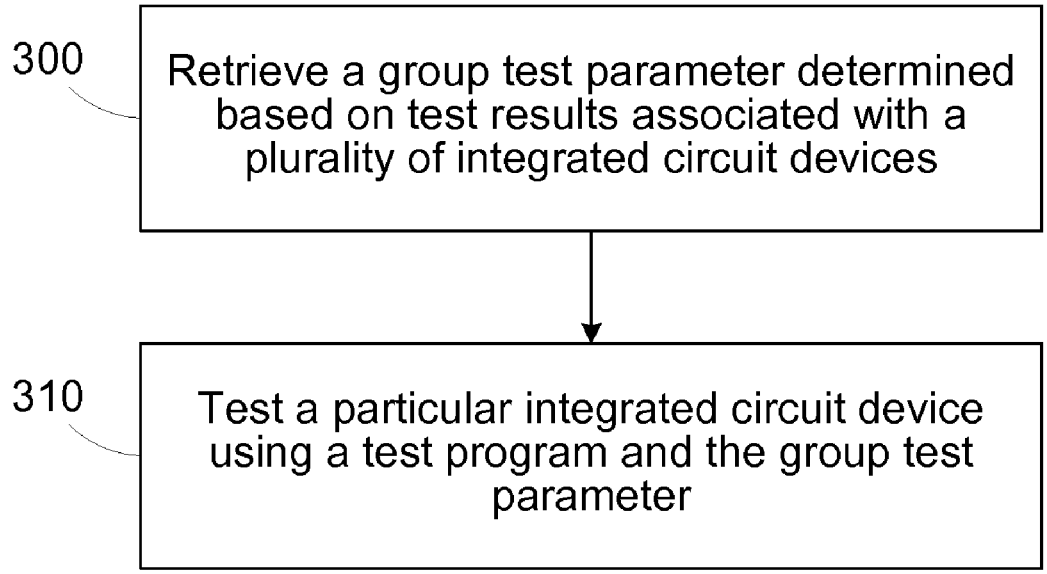
FIG. 3 is a simplified flow diagram of a method for dynamically determining tester recipes in accordance with another illustrative embodiment of the disclosed subject matter.

Turning now to FIG. 3, a simplified flow diagram of a method for testing integrated circuit devices is provided. In method block 310, a group test parameter determined based on test results associated with a plurality of integrated circuit devices is retrieved. In method block 320, a particular integrated circuit device is tested using a test program and the group test parameter.

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the disclosed subject matter. Accordingly, the protection sought herein is as set forth in the claims below.

We claim:

1. A method, comprising:

retrieving a first group test parameter determined based on test results associated with a plurality of integrated circuit devices, wherein the first group test parameter specifies a test range and a starting point for a frequency test;

testing a particular integrated circuit device using a test program and the first group test parameter by performing at least a first iteration of the frequency test at the starting point, and performing at least a second iteration of the frequency test within the test range based on the pass/fail status of the particular integrated circuit device for the first iteration of the frequency test.

2. The method of claim 1, wherein the iterative frequency test comprises an iterative frequency and voltage test of the particular integrated circuit device.

3. The method of claim 1, further comprising:

retrieving a second group test parameter specifying an acceptance criterion for the frequency test; and testing the particular integrated circuit device using the test program and the second group test parameter.

4. The method of claim 1, further comprising:

loading the test program in a tester from a first data source; and loading the first group test parameter in the tester from a second data source.

5. The method of claim 1, further comprising updating the first group test parameter.

6. A system, comprising:

a test controller operable to determine a first group test parameter based on test results associated with a plurality of integrated circuit devices, wherein the first group test parameter specifies a test range and a starting point for a frequency test; and a device tester operable to test a particular integrated circuit device using a test program and the first group test parameter by performing at least a first iteration of the frequency test at the starting point, and performing at least a second iteration of the frequency test within the test range based on the pass/fail status of the particular integrated circuit device for the first iteration of the frequency test.

7. The system of claim 6, wherein the iterative frequency test comprises an iterative frequency and voltage test of the particular integrated circuit device.

8. The system of claim 6, wherein the test controller is operable to determine a second group test parameter specifying an acceptance criterion for the frequency test and the device tester is operable to test the particular integrated circuit device using the test program and the second group test parameter.

9. The system of claim 6, further comprising a data store operable to store the test program and the first group test parameter.

10. The system of claim 9, wherein the data store includes a first database operable to store the test program and a second database operable to store the first group test parameter.

11. The system of claim 6, wherein the test control unit is operable to periodically update the first group test parameter, and the tester is operable to use the updated first group test parameter for a subsequent device test.

12. A system, comprising:

means for retrieving a first group test parameter determined based on test results associated with a plurality of integrated circuit devices, wherein the first group test parameter specifies a test range and a starting point for a frequency test; and means for testing a particular integrated circuit device using a test program and the first group test parameter by performing at least a first iteration of the frequency test at the starting point, and performing at least a second iteration of the frequency test within the test range based on the pass/fail status of the particular integrated circuit device for the first iteration of the frequency test.

* * * * *